United States Patent [19]

Price et al.

[11] Patent Number: 4,639,288
[45] Date of Patent: Jan. 27, 1987

[54] PROCESS FOR FORMATION OF TRENCH IN INTEGRATED CIRCUIT STRUCTURE USING ISOTROPIC AND ANISOTROPIC ETCHING

[75] Inventors: William L. Price, Saratoga; Ronald L. Schlupp, Los Gatos; Mammen Thomas, San Jose, all of Calif.

[73] Assignee: Advanced Micro Devices, Inc., Sunnyvale, Calif.

[21] Appl. No.: 668,225

[22] Filed: Nov. 5, 1984

[51] Int. Cl.$^4$ ................ H01L 21/306; B44C 1/22; C03C 15/00; C03C 25/06
[52] U.S. Cl. .................... 156/643; 29/576 W; 29/580; 148/187; 156/646; 156/648; 156/651; 156/653; 156/657; 156/659.1; 156/662; 204/192.32; 427/93
[58] Field of Search .............. 156/643, 646, 648, 651, 156/653, 657, 659.1, 661.1, 662; 204/164, 192 EC, 192 E; 427/38, 39, 88, 93, 94; 357/49, 50; 29/576 W, 580; 430/313, 317; 148/1.5, 187; 252/79.1

[56] References Cited

U.S. PATENT DOCUMENTS 4,472,240 9/1984 Kameyama .................... 156/651 X

FOREIGN PATENT DOCUMENTS 57-07936 1/1982 Japan .................... 156/651

Primary Examiner—William A. Powell
Attorney, Agent, or Firm—Patrick T. King; J. Vincent Tortolano; John P. Taylor

[57] ABSTRACT

An improved process is disclosed for making an integrated circuit structure wherein a trench is etched into one or more layers to electrically separate one of the devices in the integrated circuit structure from other portions thereof by first patterning silicon dioxide and silicon nitride layer on a layer of silicon. The improvement comprises isotropically etching the silicon layer to provide an enlarged shallow etch area undercutting the patterned silicon dioxide and silicon nitride layers. Subsequent deeper anisotropic etching to form the trench will result in a trench having an enlarged upper width which, in turn, prevents the formation of voids adjacent the upper portion of the trench during subsequent oxidation and polysilicon deposition steps. Possible creation of openings to such voids in the polysilicon during subsequent planarization is thereby eliminated thus avoiding undesirable oxidation of such voids and undesirable stress formation therefrom.

19 Claims, 9 Drawing Figures

PROCESS FOR FORMATION OF TRENCH IN INTEGRATED CIRCUIT STRUCTURE USING ISOTROPIC AND ANISOTROPIC ETCHING

BACKGROUND OF THE INVENTION

1. Field of the Invention

This invention relates to an improvement in a method for forming integrated circuit structures. More particularly, this invention relates to improvements in the method of forming a trench in an integrated circuit structure to separate one or more devices therein from other portions of the structure.

2. Background Art

In the formation of an integrated circuit structure, it is sometimes desirable to electrically separate or insulate one or more devices from adjacent portions of the structure by etching a slot or trench in one or more layers of the structure, usually in a silicon layer. After formation of the trench, a layer of silicon oxide is deposited or grown on the exposed surface to provide the desired electrical insulation or dielectric. However, for purposes of subsequent planarization, the groove or trench must be refilled. Conventionally, this is accomplished by depositing a layer of polysilicon followed by etching back or polishing of the surface to achieve the desired planarization.

In the normal practice of forming such a trench, conventional anisotropic etching is carried out through a mask or pattern of silicon dioxide (silox) which is placed over the silicon layer to be etched, resulting in the formation of a narrow trench having the same width as the mask. This trench will sometimes be formed somewhat bowed, i.e., it will tend to neck in at the upper corners. This, in turn, may result in the formation of a void during subsequent deposition of the polysilicon filler as shown in FIG. 1 representing the prior art.

Etching and/or polishing during subsequent planarization processing steps may open this void since it normally forms just beneath the corners, i.e., just beneath the necked down portion. Thereafter, oxidation of the planarized surface will result in undesirable oxidation of the now exposed polysilicon surfaces in the void. This oxidation, in turn, creates undesirable internal stresses due to the expanded volume of the silicon dioxide as it forms upon opposing walls of the void.

Modification of the trench profile to prevent the formation of such voids has been unsuccessful. Since, apparently, the process cannot be carried out in a manner which will prevent such formation of voids, it would be highly desirable to prevent any voids in polysilicon which do occur within the trench, as it is planarized, from being subsequently opened and exposed to undesirable oxidation.

SUMMARY OF THE INVENTION

It is therefore an object of this invention to provide an improved process for the formation of trenches in integrated circuit structures.

It is another object of the invention to provide an improved process for the formation of trenches in integrated circuit structures whereby voids formed during subsequent refilling will not be opened during planarization and subjected to undesirable oxidation.

It is a further object of this invention to provide an improved process for forming trenches in integrated circuit structures whereby the trench profile results in the formation of voids, during subsequent refilling steps, which are sufficiently removed from the surface to prevent the formation of openings thereto during subsequent etching or polishing of the surface whereby oxidation of the voids cannot occur.

These and other objects of the invention will be apparent from the following description and drawings.

In accordance with the invention, an improvement is provided in that portion of the process for making an integrated circuit structure wherein a trench is etched into one or more layers to electrically separate one of the devices from other portions. The improvement comprises isotropically etching a silicon layer through a mask layer thereon to provide an enlarged etch area undercutting the patterned mask layer whereby subsequent conventional anisotropic etching will result in a trench having an enlarged upper width to prevent the formation of voids adjacent this upper portion of the trench during subsequent oxidation and polysilicon deposition steps thereby eliminating possible opening and oxidations of such voids during subsequent etching and polishing in the planarization step and subsequent oxidation steps and the formation of undesirable stress in the integrated circuit structure is thereby avoided.

DESCRIPTION OF THE PREFERRED EMBODIMENTS

Figure 1:
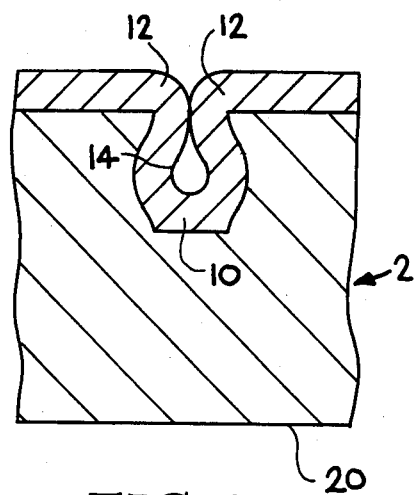
FIG. 1 is a cross-sectional view of an integrated circuit structure processed by prior art procedures illustrating a void formed during polysilicon deposition.
Figure 2:
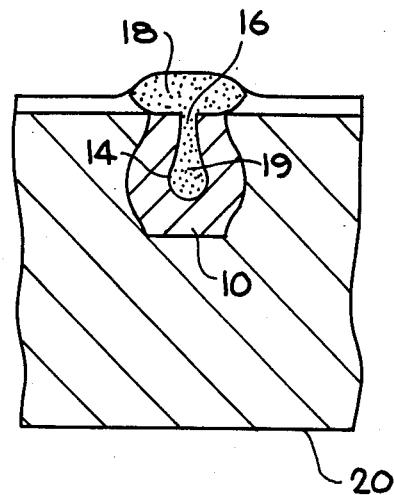
FIG. 2 is a cross-sectional view of the prior art structure of FIG. 1 after planarization of the surface illustrating an opening to the void which has occurred and subsequent oxidation of the polysilicon walls of the void.

FIG. 1 illustrates the prior art construction wherein a void 14 is formed in the polysilicon layer 10 used to fill trench 2 due to the polysilicon adjacent the corners 12 causing a necking effect. While the void, as shown in FIG. 1, is completely closed; in FIG. 2, subsequent planarization by etching and/or polishing of the surface to remove excess polysilicon can result in the formation of an opening 16 into the void. Subsequent conventional processing to place an oxide layer 18 over filled trench 2 can result in undesirable oxidation of the surfaces of the polysilicon within the void as shown at 19. This, in turn, will result in the formation of stresses due to the expanded volume of the oxides of silicon formed within the void.

Figure 3:
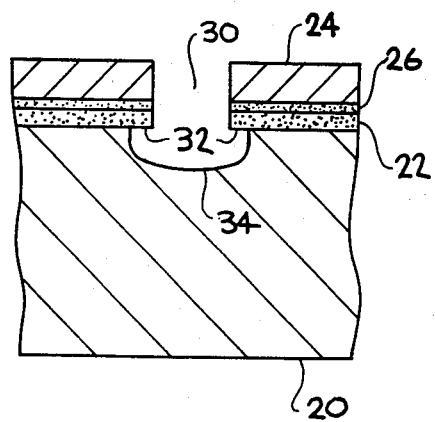
FIG. 3 is a cross-sectional view of an integrated circuit structure processed in accordance with the invention showing shallow isotropic etching.
Figure 9:
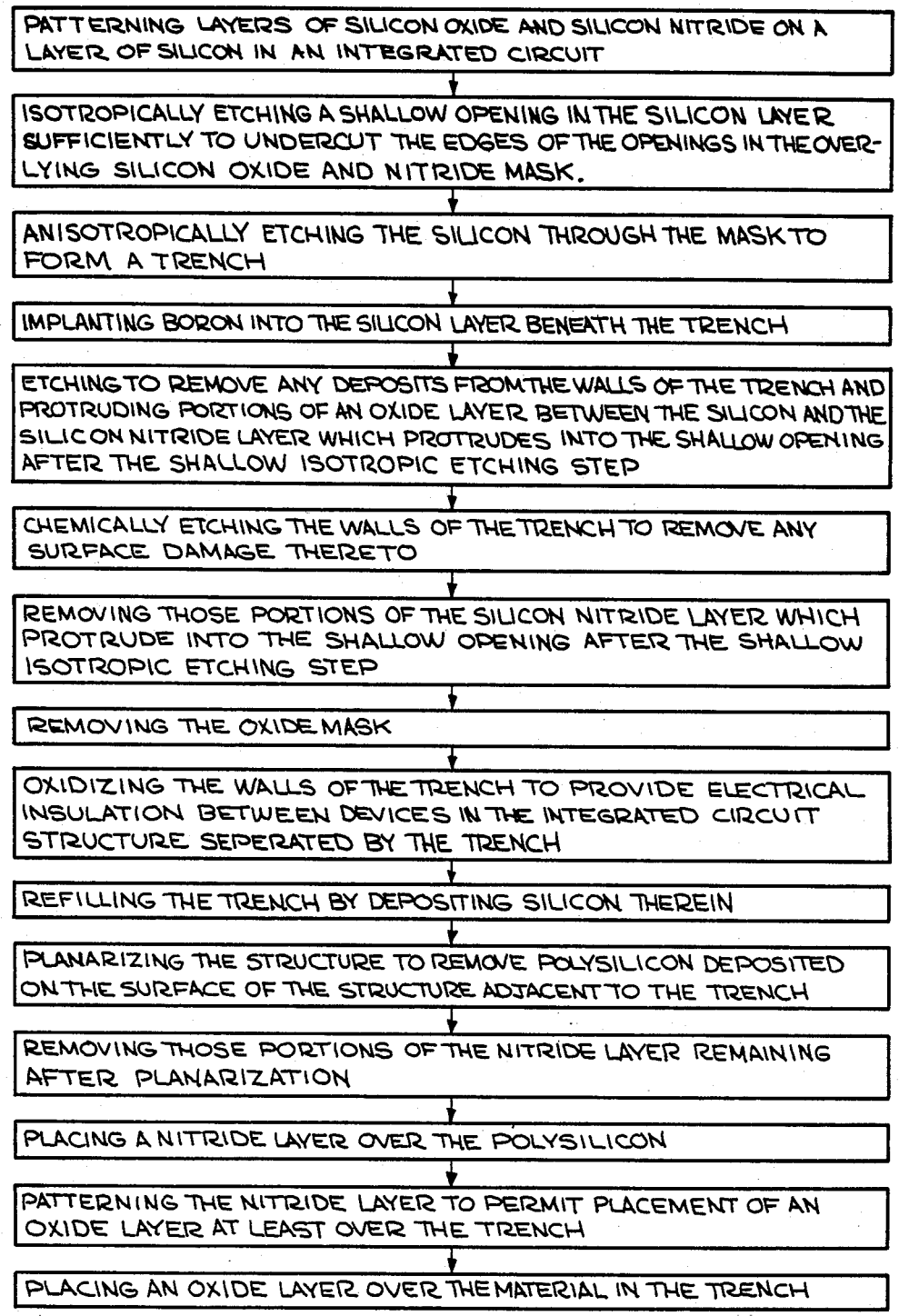
FIG. 9 is a flow sheet illustrating the process of the invention.

Referring now to FIG. 3, as well as the flow sheet in FIG. 9, in the practice of the invention, a silicon layer 20 having one or more active device regions is covered with a thin oxide layer 22 (conventionally silicon dioxide) and overlaid with a silicon nitride layer 26 and an oxide layer 24. Optionally, a second silicon nitride layer (not shown) can be applied which is separated by another oxide layer (not shown) from silicon nitride layer 26. This second nitride layer may be used, if desired, as an etchant block if oxide layer 24 etches away completely during subsequent oxide etching steps as will be described.

The oxide and nitride layers are masked and plasma etched using $CF_4+O_2$ or $CHF_3+C_2F_6$ or any other suitable chemistry to form the desired opening 30 corresponding to the desired width of the groove or trench to be formed. These process steps, up to this point, represent conventional prior art processing. The exposed silicon layer 20 is now isotropically etched through mask opening 30 using $SF_6$ plasma etch or any other suitable isotropic wet silicon etch such as a wet etch using chromic-HF to form the etched portion 34 which undercuts layers 22, 24 and 26 at 32 to provide an opening 34 which is wider than opening 30. The depth of this etch should be adequate to prevent subsequent oxidation of the voids as will be explained below. Preferably, the depth should be about 0.5 to 1.0 microns. The undercutting at 32 should be sufficient to provide a width of about 2.0 microns when the width of mask opening 30 is about 1.0 to 1.5 microns.

Figure 4:
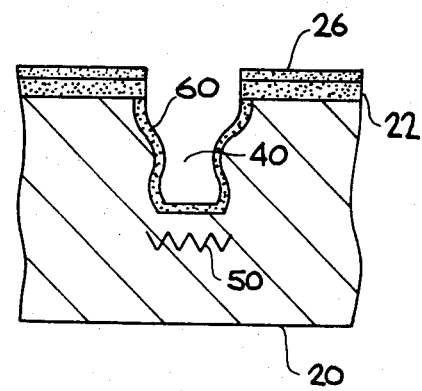
FIG. 4 is a cross-sectional view of the structure of FIG. 3 showing subsequent anisotropic etching to form the trench and subsequent oxidation to form electrical isolation.

The trench proper is now formed to the desired depth by a conventional anisotropic reactive ion etch using chlorine chemistry to a depth of about 6 microns to form the opening of trench 40 as shown in FIG. 4.

Still referring to FIG. 4, boron is then implanted at 50 in silicon layer 20 below the bottom of trench 40 using a shallow implant $B_{11}+$ source to prevent surface inversion.

A wet oxide etch, i.e. HF, is now performed to remove oxide layer 22 from under the nitride overhang at 32 as well as any oxide deposits on the trench walls. The walls of trench 40 (which includes the remaining portions of initial opening 34) are now etched to remove any surface damage on the newly formed walls using a wet silicon etch, such as iodine or $CrO_3$, to a depth of about 0.1 microns.

The nitride overhang at 32 is now removed with hot phosphoric acid. If a second nitride layer is present, as previously discussed, this layer may also be removed during this step. Oxide layer 24 is then stripped away with an HF etchant leaving nitride layer 26 over oxide layer 22.

The walls of trench 40 are now oxidized to form a thin oxide layer 60, i.e., silicon dioxide, of about 3000 Angstroms. Oxide layer 60 forms the electrical insulation or dielectric to separate the active devices in the integrated circuit structure.

Figure 5:
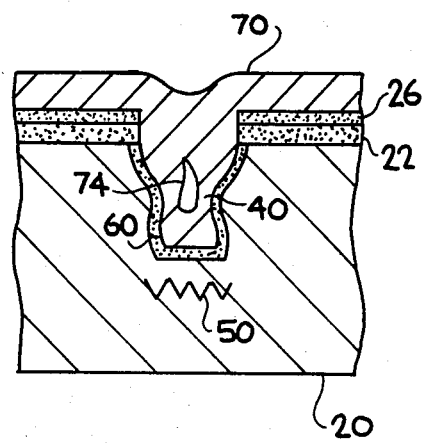
FIG. 5 is a cross-sectional view of the structure of FIG. 4 after oxidation of the trench walls and deposition of polysilicon in the trench.

Polysilicon 70 is then deposited to fill trench 40 and deposit a layer on the surface of the structure over nitride layer 26 of about 2 microns thick as shown in FIG. 5. It will be noted that a void 74 has formed in polysilicon 70. However, because of the enlarged upper portion of trench 40 formed, in accordance with the invention, by the initial isotropic etching to form opening 34, void 74, formed by necking in of the polysilicon, either due to the trench shape or the deposition itself, only occurs at a lower point in trench 40.

Figure 6:
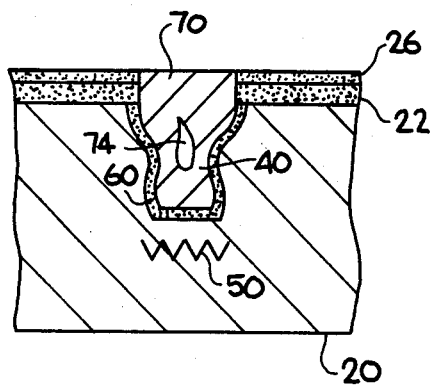
FIG. 6 is a cross-sectional view of the structure of FIG. 5 after planarization.

The surface is now planarized by polishing or by plasma or wet etching to remove polysilicon on the surface of the structure down to silicon nitride layer 26, as shown in FIG. 6. The use of the nitride layer 26 at this point aids in controlling the polishing by giving more thickness control due to the harder silicon nitride material.

Figure 7:
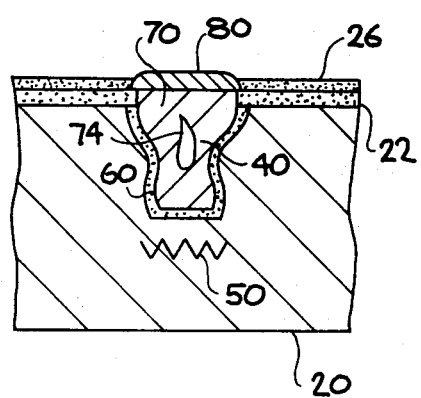
FIG. 7 is a cross-sectional view of the structure of FIG. 6 after oxidation to form a slot walled device.

An oxide layer 80 of about 1 micron thickness is grown over the polysilicon in trench 40. As shown in FIG. 7, the nitride layer 26 defines the width of trench 40 whereby oxide layer 80 only covers the polysilicon deposited in trench 40.

Figure 8:
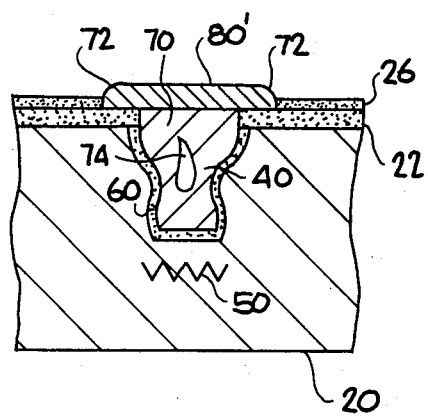
FIG. 8 is a cross-sectional view of an alternate structure to that illustrated in FIG. 7 showing a field oxide wall device constructed in accordance with the invention.

FIG. 8 illustrates an alternate embodiment wherein nitride layer 26 is masked to provide an opening wider than the trench. Oxide layer 80', grown through this mask, provides an additional area of field oxide 72 over silicon 20 adjacent trench 40. However, the device shown in FIG. 7 is preferred due to the more dense packing of devices in the integrated circuit structure which is permitted thereby.

When the alternate embodiment of FIG. 8 is used, nitride layer 26 may be optionally stripped, after planarization, and a new layer of nitride deposited to give a consistent thickness and better quality to the resulting nitride layer. As seen in FIGS. 5-8, in accordance with the invention, void 74 in polysilicon material 70 is located a considerable distance below the oxide material 80 or 80' due to the initial isotropic etching to provide the wider opening adjacent the top surface of silicon 20. The resulting wide opening causes the formation of the void 74 deeper in trench 40. Subsequent planarization, as shown in FIG. 6, does not, therefore, remove sufficient polysilicon above void 74 to provide an opening thereto which could otherwise result in oxidation of the walls of void 74 during the subsequent oxidation step to provide oxidation layer 80 or 80' over polysilicon 70.

Thus, the invention provides an improved process to form a trench in an integrated circuit structure whereby the top portion of the trench is made wider than the required ultimate width to thereby inhibit the formation of voids close to the surface during subsequent polysilicon deposition due to necking at this portion of the trench depth. It should be noted here that while the process has described a number of steps representing one embodiment of conventional processing, there may be modifications in such steps representing variations in the process of forming the trench as is well known to those skilled in the art without departing from the spirit of the invention. That is, other process steps may be used in conjunction with the formation of an initial wide shallow opening by the isotropic etch of the invention without departing from the scope of the invention which is to be limited only by the appended claims.

Having thus described the invention, what is claimed is:

1. An improved method for making a trench in an integrated circuit structure wherein voids formed during deposition of material to refill the trench are not opened during planarization whereby oxidation of the walls of the void is prevented, the method comprising:
    (a) patterning a silicon oxide layer previously deposited on a silicon integrated circuit structure containing device regions to be separated by said trench to form a mask;
    (b) isotropically etching through said mask a shallow opening in said silicon layer sufficiently to undercut the edges of the openings in said overlying silicon oxide mask;

(c) anisotropically etching said silicon through said same mask to the desired depth of the trench;

(d) oxidizing the walls of said trench to provide electrical insulation between devices in said integrated circuit structure separated by said trench;

(e) refilling the trench by depositing material therein;

(f) planarizing said structure to remove any of said material deposited on the surface of said structure adjacent said trench; and (g) growing an oxide layer layer said material in said trench.

2. The method of claim 1 including the further step of implanting boron into the region of said silicon layer beneath said trench prior to said oxidation.

3. The method of claim 2 including the step of etching said trench to clean said walls and repair any damage after said anisotropic etching step and removal of said oxide mask.

4. The method of claim 3 wherein said patterning step includes patterning a layer of nitride positioned between said silicon oxide mask and said silicon layer.

5. The method of claim 4 including the further step, after said anisotropic step, of removing those portions of said nitride layer above an oxide layer and in between said oxide mask and said silicon which protrude into said shallow opening after said shallow isotropic etching step.

6. The method of claim 5 including the step of removing said oxide mask before said oxidizing of said trench walls and any depositions in said trench.

7. The method of claim 6 wherein said material used to refill said trench is polysilicon.

8. The method of claim 7 including the further step of patterning said nitride layer after said planarization step to permit growing an oxide region between the edge of said trench and adjacent active device regions as well as over said trench.

9. The method of claim 7 including the further steps of placing a further nitride layer on said structure after said planarization step and patterning said further nitride layer to permit placement of an oxide layer over at least said trench.

10. The method of claim 7 wherein said isotropic etching step is carried out for a sufficient time to permit said shallow opening to reach a depth of 0.5 to 1.0 microns.

11. The method of claim 10 wherein said isotropic etching step comprises plasma etching said silicon with $SF_6$.

12. The method of claim 10 wherein said isotropic etching step comprises etching with a chemical etch capable of attacking silicon.

13. The method of claim 10 wherein said anisotropic etch step uses a reactive ion etch.

14. The method of claim 13 wherein said anisotropic etch step is carried out for a time period sufficient to provide a trench depth of about 6 microns.

15. In a process for making an integrated circuit structure wherein a trench is etched into one or more layers to electrically separate one of the devices in the integrated circuit structure from other portions thereof by first patterning a silicon oxide layer which is on a layer of silicon to form a mask, the improvement which comprises: isotropically etching said silicon layer through said mask to provide an enlarged shallow etch area undercutting said patterned silicon oxide mask; whereby subsequent deeper anisotropic etching through the same mask to form said trench will result in a trench having an enlarged upper width to prevent the formation of voids adjacent the upper portion of the trench during subsequent oxidation and polysilicon deposition steps thereby eliminating possible creation of openings to such voids in said polysilicon during subsequent planarization and resultant undesirable oxidation of such voids and undesirable stress formation therefrom.

16. The method of claim 15 wherein said isotropic etching step is carried out for a sufficient time to permit said shallow opening to reach a depth of 0.5 to 1.0 microns.

17. The method of claim 16 wherein said isotropic etching step comprises plasma etching said silicon with $SF_6$.

18. The method of claim 16 wherein said isotropic etching step comprises etching with a chemical etch capable of attacking silicon.

19. An improved method for making a trench in an integrated circuit structure wherein any voids formed during deposition of polysilicon to refill the trench are not opened during planarization whereby oxidation of the walls of the void is prevented, the method comprising:

(a) patterning layers of silicon oxide and silicon nitride previously deposited over a layer of silicon on an integrated circuit structure containing devices to be separated by said trench to form a mask;

(b) isotropically etching a shallow opening in said silicon layer through said mask sufficiently to undercut the edges of the openings in said overlying silicon oxide and nitride mask and to provide an opening depth of 0.5 to 1.0 microns;

(c) anisotropically etching said silicon through said same mask to the desired depth of the trench;

(d) implanting boron into the region of said silicon layer beneath said trench;

(e) etching to remove any deposits from the walls of said trench and to remove protruding portions of an oxide layer between said silicon and said silicon nitride layer which protrudes into said shallow opening after said shallow isotropic etching step;

(f) chemically etching the walls of said trench to remove any surface damage thereto;

(g) removing those portions of said silicon nitride layer which protrude into said shallow opening after said shallow isotropic etching step;

(h) removing said oxide mask;

(i) oxidizing the walls of said trench to provide electrical insulation between devices in said integrated circuit structure separated by said trench;

(j) refilling said trench by depositing silicon therein;

(k) planarizing said structure to remove polysilicon deposited on the surface of said structure adjacent said trench;

(l) removing those portions of said nitride layer remaining after polishing (m) placing a nitride layer over said polysilicon;

(n) patterning said nitride layer to permit placement of an oxide layer at least over said trench; and (o) placing an oxide layer over said material in said trench.

* * * * *